United States Patent [19]

Compton et al.

[11] Patent Number: 4,673,880
[45] Date of Patent: Jun. 16, 1987

[54] PHASE SENSITIVE DETECTION IN MULTISLICE MAGNETIC RESONANCE IMAGING SYSTEMS

[75] Inventors: Russell A. Compton, Chesterland; John T. Keller, Willoughby, Ohio; Thomas R. McBride, Newberry; David M. Kramer, Cleveland Heights, all of Ohio

[73] Assignee: Technicare Corporation, Cleveland, Ohio

[21] Appl. No.: 766,617

[22] Filed: Aug. 16, 1985

[51] Int. Cl.⁴ .......................................... G01R 33/20
[52] U.S. Cl. .................................................. 324/309
[58] Field of Search ............... 324/300, 307, 309, 311, 324/312, 314

[56] References Cited

U.S. PATENT DOCUMENTS

| 4,015,196 | 3/1977 | Moore et al. | 324/309 |
| 4,297,637 | 10/1981 | Crooks et al. | 324/309 |
| 4,318,043 | 3/1982 | Crooks et al. | 324/309 |

Primary Examiner—Michael J. Tokar
Attorney, Agent, or Firm—W. Brinton Yorks, Jr.

[57] ABSTRACT

In a magnetic resonance imaging system, the same reference signal is used for both radio frequency transmission and phase sensitive detection. The use of the same reference signal for both transmission and reception prevents phase unlock between the two events. However, this technique results in variation in the demodulated, frequency encoded information, which is corrected by digitally filtering the received signal information as a function of the demodulation frequency used.

10 Claims, 7 Drawing Figures

PHASE SENSITIVE DETECTION IN MULTISLICE MAGNETIC RESONANCE IMAGING SYSTEMS

This invention relates to magnetic resonance imaging (MRI) systems, and in particular to the phase sensitive detection of nuclear magnetic resonance (NMR) signals in such systems.

In MRI, a common imaging technique is the formation of images of selected planes, or slices, of the subject being imaged. Typically the subject is located in the static magnetic field with the physical region of the slice at the geometric center of the gradient field. The field center is the point where the gradients of the x, y and z dimensions all have nominal zero values. Generally, each gradient will exhibit an increasing field strength on one side of the field center, and a decreasing field strength on the other side, both variations progressing in the direction of the particular gradient. The field strength at the field center will thus correspond to a nominal Larmor frequency for the MRI system, usually equal to that of the static magnetic field.

The radio frequency (RF) coils which transmit RF excitation pulses to the subject and receive NMR signals in return are normally tuned about the nominal Larmor frequency. Correspondingly, the RF transmitters and receivers are similarly adjusted with bandwidths centered about this frequency. With the region of the slice located at the field center, the transmitted and received signals will be in a range about the nominal frequency.

It is often desirable to acquire several slice images from various regions of the subject for better diagnostic utility. In order to make efficient use of the MRI system, techniques have been developed for acquiring image information from multiple slices simultaneously, such as the techniques described in concurrently filed U.S. patent application Ser. No. 766,613, entitled "MULTIPLEXED MAGNETIC RESONANCE IMAGING OF VOLUMETRIC REGIONS". When multiple slices are imaged simultaneously, one may be located at the field center, but others will be located elsewhere in the gradient fields. Thus, a number of slices will be located in field regions of Larmor frequencies other than the nominal center frequency. The bandwidths of the transmitting and receiving coils and circuitry must therefore be adjusted to accommodate the transmission and reception of signals over a wider range of frequencies.

Multiple slice imaging presents a partricular problem in that slices located at other than the field center will respond to and emit signals of different frequencies and frequency bands during excitation and NMR signal emission. An off-center slice will be selected by an excitation signal of a frequency other than the nominal system center frequency, but reception in the presence of a frequency-encoding "read" gradient may still be over a frequency band centered about the nominal center frequency. The problem that develops is that frequencies and bandwidths must then be changed between excitation and NMR signal reception.

A straight-forward approach to the above problem is to transmit at a selected, narrow frequency band to excite the desired slice, then receive signals over a broad band, with a center frequency that is always the same as the nominal center frequency, thereby aligning the receiver band with the read gradient field. However, the slice will be excited in relation to both the frequency and phase characteristics of the transmitted excitation signals. Subsequence encoding of the NMR spin systems proceeds from the phase reference of the transmitted signal. To properly decode the received NMR signal information, the phase reference of the transmitted signal must be utilized during NMR signal reception. But if the frequency is changed in preparation for reception the phase reference may be lost; the phase may become "unlocked". Thus, some technique is necessary to maintain the phase lock between transmission and reception when the frequency is changed.

One technique is to use a reference frequency source that smoothly changes frequency while maintaining a known phase characteristic. However, it has been found that such systems are not always reliable, and that some phase variation may be experienced from time to time when the frequency is changed after transmission. This problem is usually not realized until after the scanning has been completed and it is discovered that the processing system cannot reconstruct a coherent image.

A second technique is to use a multiple frequency reference source that provides separate, phase-locked signals for transmission and reception. One such system would derive the two signals from a high frequency master reference signal which is divided down in frequency. However, this arrangement restricts both the spacing of the slices and signal timing to predetermined choices, a penalty in system flexibility. To overcome this, the multiple frequency source may attempt to phase-align two completely variable frequency signals. This too, presents a problem in that signals of different frequencies may be phase-compared only when they momentarily achieve phase alignment, which happens only once every inverse difference frequency. The closer the frequencies of the signals, the less often they are in alignment, and hence the less often a phase correction can be made.

Yet another technique is to offset the frequency-encoding gradient with a uniform bias field so that its center frequency matches the center transmit frequency, as by using the bias coil described in U.S. patent application Ser. No. 621,396, entitled "OFFSET GRADIENT FIELDS IN NUCLEAR MAGNETIC RESONANCE IMAGING SYSTEMS", filed June 18, 1984. However, since any gradient can be a slice-selecting gradient, all gradient coils must respond identically to gradient pulses of the same rise times and pulse area integrals. This requires substantial manufacturing precision and constant adjustment during system use to maintain the necessary gradient accuracy.

A final technique is to employ a stabilizing circuit for the reference frequency source which will set the phase to a particular value each time the frequency is changed. Such a circuit is difficult to produce, and can suffer from instability which makes it no more reliable than the first technique.

In accordance with the principles of the present invention, an MRI system is provided which overcomes the problems of the aforementioned techniques for phase sensitive detection. In an embodiment of the present invention, each spatially different image slice is interrogated at its own particular frequency. A selected common frequency is used for excitation and for reception of NMR signal information from each particular slice. Since the frequency is not changed between the transmit and receive cycles the phase reference is not unlocked between the two cycles. However, the use of a different frequency reference for each slice causes an apparent left/right frequency shift in the demodulated information signals. This undesired shift is corrected by modulating the received signals with the trigonometric function of the difference frequency of the demodulating signal and a given reference frequency. By using a common frequency for both transmission and reception the phase information of the NMR signals is preserved, and by knowing the frequency offset between the selected frequency and the given reference frequency the misregistration introduced by the frequency offset is eliminated.

Figure 1:
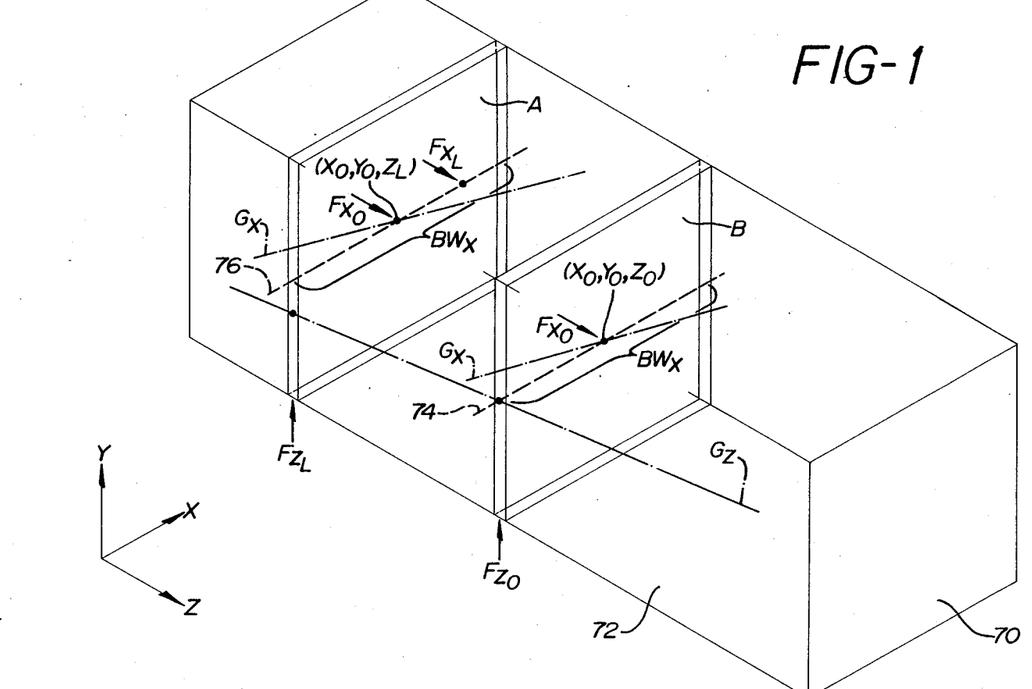
FIG. 1 illustrates the frequency differences between two slices of different spatial location.

Referring first to FIG. 1, a block of material 70 containing slices A and B is shown. The block is oriented with respect to the x, y and z axes drawn next to the block, with the null point of the gradient fields centered with respect to slice B. An x-directed gradient $G_x$ is drawn to show the variation of the gradient field for the x-direction. Its degree of variation is indicated with respect to an x-axis line 74 drawn in the plane of and through the center of the slice. A z-directed gradient $G_z$ is also shown, and for clarity of illustration the $G_z$ gradient is drawn in the plane of the forward face 72 of the block. The $G_z$ gradient field has its null point coincident with the x-axis line 74. The center of the slice B at the center of the gradient field thus has a coordinate value with respect to the gradients of $(X_o, Y_o, Z_o)$.

The slice B is excited by a radio frequency (RF) signal having a narrow frequency band centered around frequency $F_{Zo}$, as indicated by the arrow below the slice B. The frequency $F_{Zo}$ is the characteristic frequency at the null point of the $G_z$ gradient field. When the NMR signals resulting from the excited nuclei of the slice are to be read, a read gradient $G_x$ is applied. The acquired signals are spatially encoded by frequency variation along the x-direction in a band of frequencies $BW_x$. The center of the $BW_x$ band is indicated by a frequency $F_{Xo}$, which is the characteristic frequency at the null point of the $G_z$ gradient field. Since both center frequencies $F_{Zo}$ and $F_{Xo}$ are at field null points where the field is equal to the static magnetic field, the two center frequencies are equal, $F_{Zo}=F_{Xo}$. Thus the use of a common reference frequency for both the transmitter and receiver, equal to $F_{Zo}$ and $F_{Xo}$, may be used to generate and demodulate signals from slice B. Since the reference frequency does not have to be changed, there will be no loss of the phase reference, or "unlock", when the received signals are demodulated.

The slice A is also shown with respect to the $G_x$ gradient, which is drawn with reference to an x-axis line 76 passing through the center of slice A and in the plane of the slice. The center of slice A is also located at the null point of the $G_x$ gradient field. However, the $G_z$ gradient in the plane of the face 72 of block 70 is seen to be below the x-axis line 76, because the slice A is in a field location of the $G_z$ gradient field which differs from that at the null point. Thus, the center of the slice A has a coordinate value with respect to the gradients of $(X_o, Y_o, Z_L)$.

The slice A is excited with respect to the $G_z$ gradient field by an RF signal having a frequency band centered around frequency $F_{ZL}$, as indicated by the arrow below the slice A. The frequency $F_{ZL}$ is the characteristic frequency of the $G_z$ gradient field in the plane of the x-axis line 76, the slice A plane. When the resulting NMR signals are to be read, the slice gradient $G_z$ is removed and the read gradient $G_x$ is applied to the slice A. Spatially encoded signals from slice A will, as before, occupy a band of frequencies $BW_x$ centered around frequency $F_{Xo}$. The frequency $F_{Xo}$ is the characteristic frequency at the null point of the $G_x$ gradient field, while the frequency $F_{ZL}$ is characteristic of an off-null point of the $G_z$ gradient field, such as the point indicated by arrow $F_{XL}$. Thus, $F_{ZL}$ is not equal to $F_{Xo}$.

In prior NMR apparatus, the difference between $F_{ZL}$ and $F_{Xo}$ for slice A was taken into account by using a transmit reference frequency equal to $F_{ZL}$, then switching to a receive reference frequency equal to $F_{Xo}$. As mentioned above, this frequency change can cause a loss of the phase reference used in the excitation of the slice A. In order to image the slice A using Fourier transform reconstruction, the acquired NMR information over a number of scans must correspond to a known common phase reference. This is because the Fourier processing is essentially a correlation technique. When the phase reference is unlocked, the phase references for respective data lines will not be precisely correlated. Thus the Fourier transform processor will be operating upon spatially uncorrelated information, and will not accurately reproduce the desired spatially-encoded slice. The problem will manifest itself in the form of ghosts in the slice A image or, in extreme cases, in an unrecognizable image.

In accordance with the principles of the present invention, the phase unlock problem is overcome by using the same reference signal for both RF transmission and NMR signal reception and demodulation. In the case of an off-center slice such as slice A of FIG. 1, however, this creates a further complication. When a frequency equal to $F_{ZL}$ is used as the reference signal for both transmission and reception, the $F_{ZL}$ frequency will be at a point on the x-axis reference line 76 which is other than the center point, since $F_{Xo}$ is not equal to $F_{ZL}$. This may be a frequency such as the point indicated by the arrow of frequency $F_{XL}$, for instance, where $F_{XL}=F_{ZL}$. Demodulation will thus occur with respect to a band of frequencies centered about frequency $F_{XL}$. This new band of demodulated frequencies will be offset from the desired frequency-encoded band of $BW_x$. This condition of frequency band offset will be discussed further below.

Figure 2:
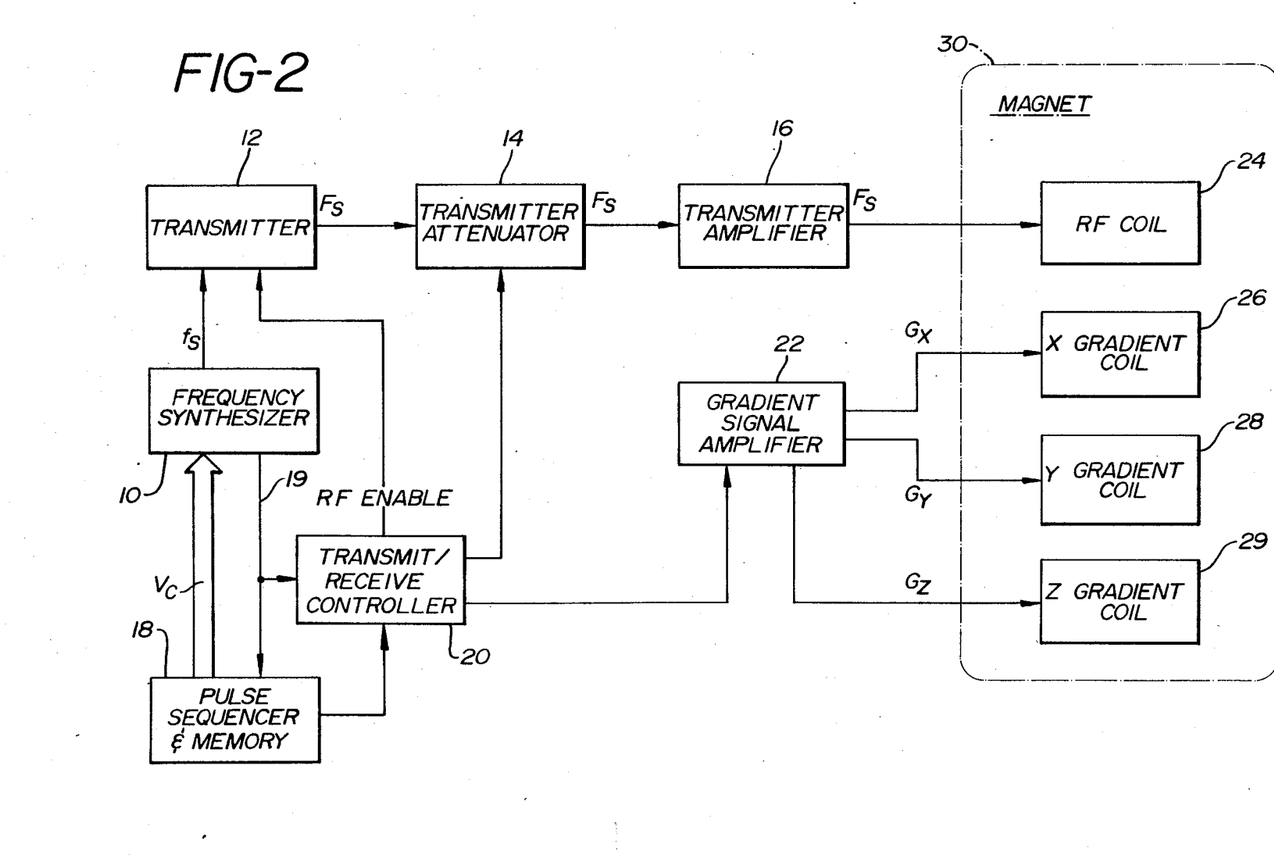
FIGS. 2 and 3 illustrate an MRI system constructed in accordance with the principles of the present invention.
Figure 3:
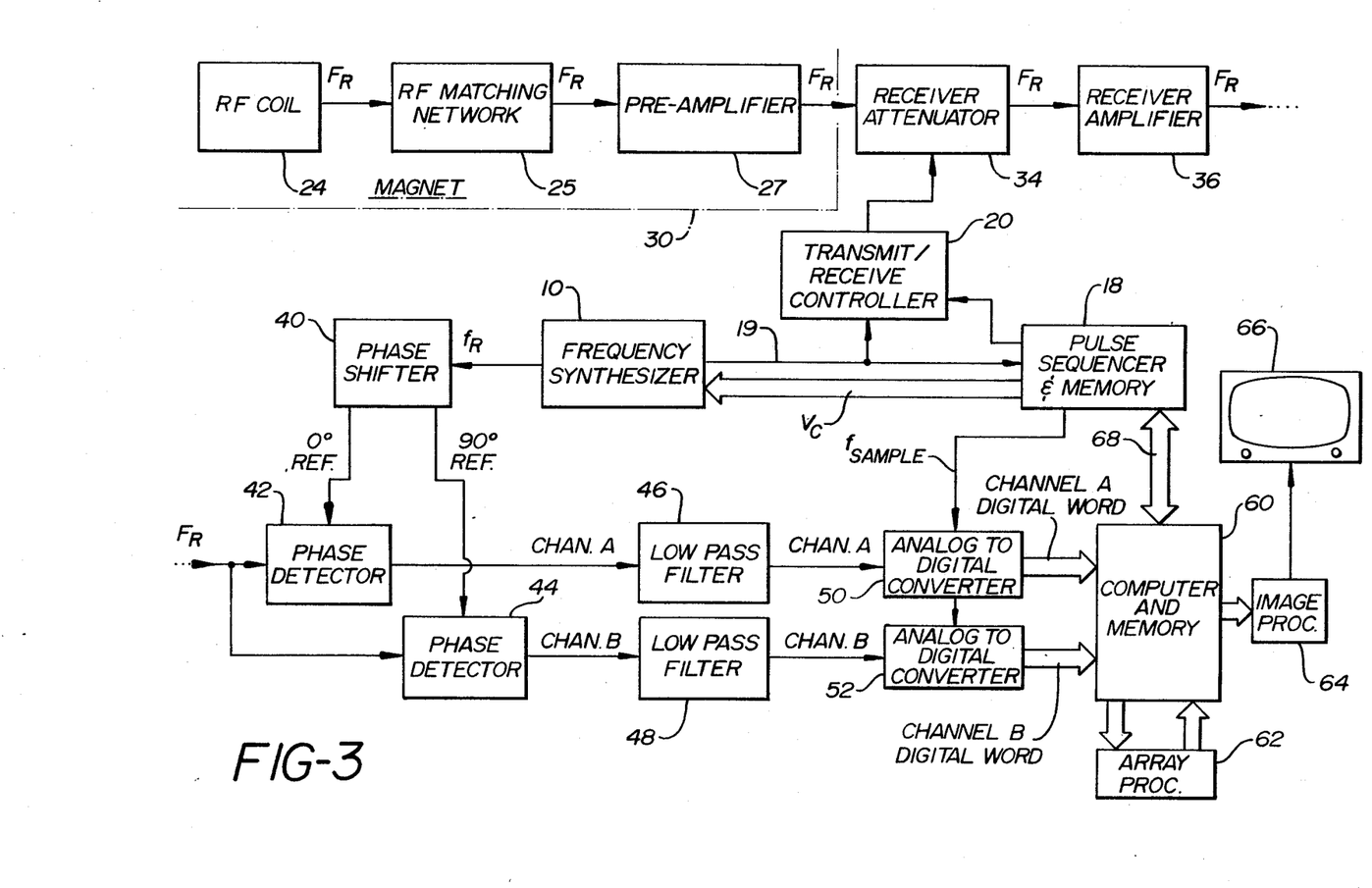

The NMR techniques of the present invention may be performed by an MRI system such as that shown in block diagram form in FIGS. 2 and 3. Referring to FIG. 2, the transmission portion of an MRI system is shown. A pulse sequencer and memory 18 applies a control signal $V_c$ to a frequency synthesizer 10. In response to the $V_c$ control signal, the frequency synthesizer 10 applies and $f_s$ transmit reference signal to a transmitter 12, where $F_s$ is the center frequency of a transmitted radio frequency signal. The transmitter 12 produces a timed transmit $F_s$ signal, which is coupled by way of a controlled transmitter attenuator 14 to a transmitter amplifier 16. The transmitter 12 and attenuator 14 are controlled by control signals provided by a transmit/receive controller 20, which is under control of the pulse sequencer 18. The $F_s$ signal is amplified by the amplifier 16 and applied to the RF coil 24 in the magnet 30 in the form of a sequence of pulses formed under control of the transmit/receive controller 20. The RF coil 24 applies the $F_s$ pulses to the subject being imaged. In order to synchronize the timings of the applied signals, timing control signals are also produced by the frequency synthesizer 10 and coupled to the transmit/receive controller and the pulse sequencer on line 19.

Also located within the field of the magnet 30 are x, y, and z gradient coils 26, 28, and 29. These coils receive gradient control signals $G_x$, $G_y$, and $G_z$ from gradient signal amplifier 22. The control signals are provided by the transmit/receive controller 20.

Turning now to FIG. 3, the NMR signals emitted by the nuclei of the material being imaged induce $F_R$ return signals in the RF coil 24. These return signals are coupled by way of an RF matching network 25 to a preamplifier 27, and on to a receiver attenuator 34. The receiver attenuator is controlled by the transmit/receive controller 20. The received $F_R$ signals are amplified by an amplifier 36 and applied to quadrature phase detectors 42 and 44. The phase detectors receive two phase demodulating signals at respective 0° and 90° phase angles from a phase shifter 40, which receives reference signal $f_R$ from the frequency synthesizer 10. The phase detectors 42 and 44 produce a channel A and a channel B signal, respectively. The baseband channel A and B signals are filtered by respective low pass filters 46 and 48, and the filtered signals are then sampled by respective analog to digital converters 50 and 52 in response to a sampling signal $f_{sample}$ produced by the pulse sequencer 18. The resultant channel A and channel B digital words are stored in the memory of a computer 60. The computer and memory 60 also exchanges information with the pulse sequencer and memory 18 by way of a data link 68. The channel A and B digital words are processed, combined and transformed to the frequency domain by a Fourier transform array processor 62. The resultant image signals are assembled in an image format by an image processor 64, and the processed image is displayed on a video monitor 66.

Figure 4:
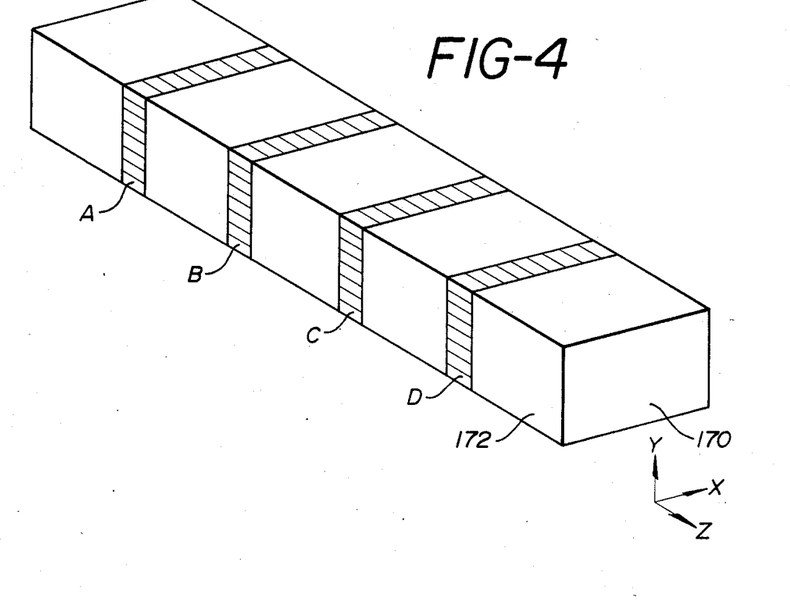
FIG. 4 illustrates a block of material, multiple slices of which are to be imaged.

Referring now to FIG. 4 a rectangular block of material 70 which is to be imaged by the system of FIGS. 3 and 4 is shown. Four slices, A, B, C and D, of the block are to be imaged using a multi-slice, multi-echo format. The coordinates of the block are as indicated by the x, y and z coordinate axes shown adjacent the block 70. One face 172 of the block 70 is specifically indicated.

Figure 5:
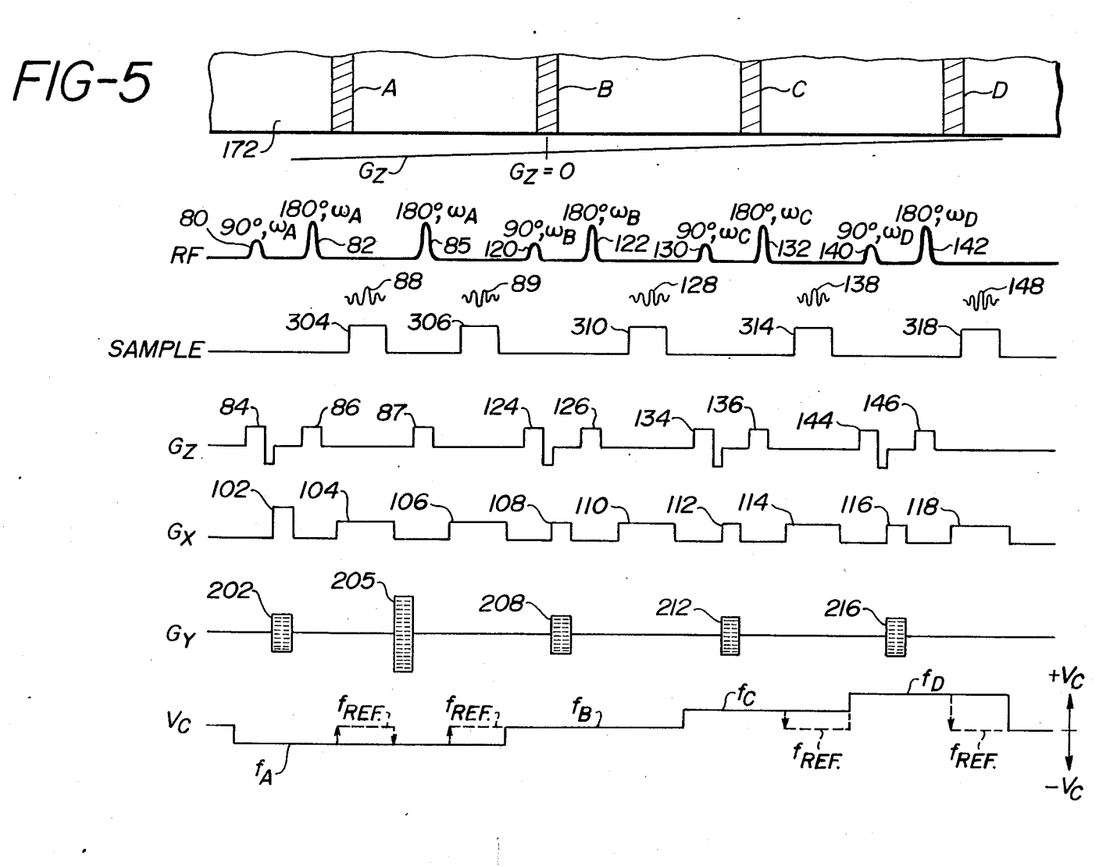
FIG. 5 illustrates waveforms involved in the imaging of the multiple slices of FIG. 5 in accordance with the principles of the present invention.

FIG. 5 shows waveforms for imaging the four slices of block 170. At the top of the FIGURE the face 172 of the block is partially shown with reference to a z-directed gradient $G_z$. Slice B of the block is centered at the center, or null point of the $G_z$ gradient field. The null point is the point at which the $G_z$ gradient makes substantially no contribution to the static magnetic field ($G_z = 0$). On either side of the null point the gradient field increases relatively positively or negatively.

Slice A is scanned first by applying a frequency selective 90° RF pulse 80 together with a slice selecting $G_z$ gradient 84. The 90° pulse 80 exhibits a frequency characteristic $\omega_A$ for spatial selection of slice A. A preconditioning $G_x$ gradient 102 is applied to the slice and one level of a level variable phase encoding $G_y$ gradient 202 is applied to spatially encode the slice in the y direction. A frequency selective 180° RF pulse 82 is then applied to the block together with $G_z$ gradient 86, resulting in the later formation of a spin echo signal 88. The spin echo signal 88 is sampled during a sampling interval 304 in the presence of a frequency-encoding read gradient 104 for the x direction, $G_x$.

A second spin echo signal is acquired from slice A by applying one level of a second phase-encoding $G_y$ gradient 205 to the block 170, followed by a second 180° RF pulse 85 in the presence of $G_z$ gradient 87. A second spin echo signal 89 develops and is sampled during a sampling period 306 in the presence of a $G_x$ gradient 106. The second $G_y$ gradient 205 has a level chosen to provide twice the phase-encoding effect as the first $G_y$ gradient 202, but in an opposite sense. This compensates for the phase reversal caused by the two 180° RF pulses 82 and 85 and causes the phases of the spin echo signal 89 to be of the same sense for processing. By effectively flipping the signal phase in the y-direction, the $G_y$ gradient 205 eliminates ghosts in the second echo image by causing them to superimpose and cancel.

During this multi-echo scan of slice A, the frequency synthesizer of FIG. 2 is receiving a $V_c$ control signal from the pulse sequencer 18 as indicated at the bottom of FIG. 5. This control voltage causes the reference frequency produced by the frequency synthesizer 10, $f_s$, to be equal to a frequency $f_A$ as indicated in FIG. 5. The reference signal for the transmitter 12 is thereby set to $f_s = f_A$ and the transmitted RF signal is centered about frequency $f_A$.

Although the received NMR signals will be centered about a reference frequency $f_{REF}$, corresponding to the null point of the $G_x$ gradient field, they are demodulated by the phase detectors of FIG. 3 by a reference signal $f_R = f_A$. This demodulating signal determines the spatial representation of the frequency-encoded signal information. In prior apparatus the receiver reference signal was frequency shifted for reception to the nominal reference frequency $f_{REF}$, as indicated by the broken lines beneath the frequency encoding gradients 104 and 106. However, this change in frequency would distrub the phase lock of the reference signals applied to phase detectors 42 and 44, which unlock is indicated by the arrows on the broken lines at the bottom of FIG. 5. The phase unlock results in erroneous phase-sensitive detection of the received NMR signals, and would also unlock the phase reference of the individual RF pulses in the multi-echo sequence.

The phase unlocking is prevented in apparatus of the present invention by maintaining the same control signal $V_c$ for the frequency synthesizer 10 during the entire transmit and receive cycle, as indicated by solid line $f_A$ in FIG. 5. The phase detector 42 and 44 receive reference signals which are still aligned in phase with the $f_s = f_A$ reference used during transmission, as $f_s = f_A = f_R$. The phase-encoded NMR signal information is thus accurately detected for precise image reconstruction.

But since the demodulating signal is at a frequency $f_R = f_A$ instead of the $f_{REF}$ center of the received signal band, there is a shift of both the bandwidth and center frequency of the information which has been frequency-encoded in the x-direction. Unless this frequency shift is taken into consideration, there will be a spatial shift in the x direction of the reconstructed image of slice A relative to the positioning of the other slices. For instance, if the frequency shift is 1 KHz from $f_{REF}$ to $f_A$ and the image resolution is 100 Hz per image pixel, the image will be repositioned in the x direction by ten pixels. The repositioning can be either to the left or the right, depending upon whether $f_A$ is above or below $f_{REF}$.

Continuing on with FIG. 5, a single echo scan is performed on slice B. Since this slice is centered in the gradient field, the $v_c$ control signal for the frequency synthesizer 10 sets $f_s$ to $f_b$, which is equal to the nominal $f_{REF}$ reference frequency. The reference frequency for the frequency synthesizer 10 is thus equal to $f_S = f_B = f_{REF}$. A 90° RF pulse 120 with a frequency spectral content of $\omega_B$ and centered about $f_s = f_b$ is applied to block 170 in the presence of a $G_z$ gradient 124. After this selction of slice B, a $G_x$ gradient 108 and one level of the amplitude variable $G_y$ gradient 208 are applied to the block for spatial encoding. A 180° RF pulse 122 with frequency spectral content $\omega_B$ is applied in the presence of $G_z$ gradient 126, which results in the development of a spin echo signal 128. This signal is sampled during sampling interval 310 in the presence of a $G_x$ frequency encoding gradient 110. Since the slice selection and sampling of the frequency encoded spin echo signal are both done at the nominal center frequency of $f_{REF}$, this slice is effectively interrogated in the same manner as was done in the prior apparatus. The frequencies $f_s$, $f_R$ and $f_B$ are all equal to $f_{REF}$.

Slice C is selected next by applying a 90° RF pulse 130 with a frequency spectral content of $\omega_C$ to the block in the presence of a $G_z$ gradient 134. For slice C, the $V_c$ control signal is changed to a level so that the $f_s$ signal of the frequency synthesizer 18 is at a frequency $f_C$ as indicated at the bottom of FIG. 5. This means that the transmitted RF signal $F_s$ is centered about $f_C$, and the reference signal for the phase detectors is equal to $f_R = f_C$. After the spatial encoding $G_x$ and $G_Y$ gradients 112 and 212 are applied to the block and a 180° frequency selective RF pulse 132 is applied in the presence of a $G_z$ gradient 136, the prior apparatus would have switched the $V_c$ control signal back to the $f_{REF}$ level, as indicated by the broken line beneath the frequency encoding $G_x$ gradient 114. However, in the present apparatus the phase unlocking resulting from such switching is prevented by maintaining the demodulating reference frequency at $f_R = f_C$ during this time. A spin echo signal 138 from slice C is thus phase detected in relation to the $f_C$ reference frequency during a sampling interval 314 in the presence of $G_x$ gradient 114.

The fourth slice D is the slice most distant from the null point of the gradient field. Accordingly, the $V_c$ control signal is switched to an even greater offset level as shown by the $V_c$ line of FIG. 5, causing the frequency synthesizer signal $f_s$ to be offset to a frequency $f_D$. The slice D is selected by applying a 90° RF pulse 140 with a frequency spectral content $\omega_D$ and centered about frequency $f_D$ to the block 170 in the presence of $G_z$ gradient 144. A $G_x$ gradient 116 and one level of $G_y$ gradient 216 are applied to the block, followed by a frequency selective 180° RF pulse 142 which is applied in the presence of $G_z$ gradient 146. The resulting spin echo signal 148 is sampled during an interval 318 in the presence of frequency encoding $G_x$ gradient 118 without switching the demodulating reference frequency to the $f_{REF}$ frequency as indicated by the dashed lines in the $V_c$ signal line.

A scan of all four slices is completed at this point. The sequence of FIG. 4 is then repeated numerous times, each with a variation of the level of the phase encoding $G_y$ gradients 202–216, until sufficient iterations have been performed and signals gathered for Fourier transform image reconstruction of the four slices.

Figure 6:
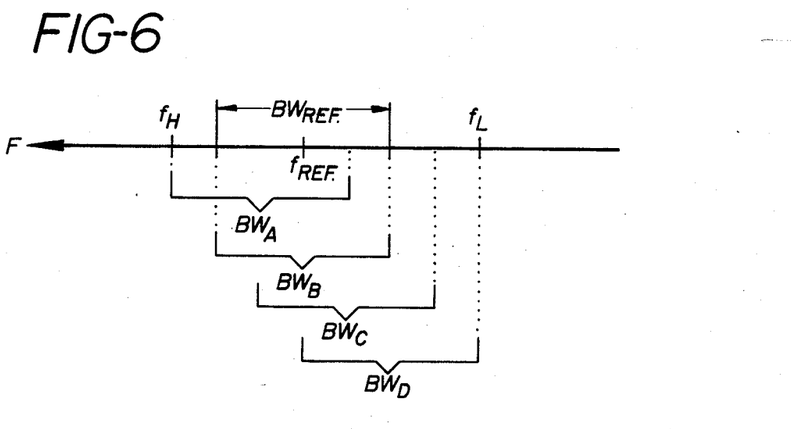
FIG. 6 illustrates frequency bands of different slices in the frequency-encoding direction.

The offsets caused by the changing $V_c$ control signal and attendant frequency changes are illustrated in FIG. 6. The nominal bandwidth of the received NMR signals when the demodulating reference frequency is reset to $f_{REF}$ during each sampling interval is indicated as $BW_{REF}$, with a center frequency of $f_{REF}$. However, when the reference frequency is maintained during both transmission and reception for phase detection stability, the detected NMR signals from the four slices occupy different bands as shown in the FIGURE. The bandwidth of the slice A signals is offset above the nominal band, as indicated by bandwidth $BW_A$. Slice B, which is centered in the gradient field, has a bandwidth $BW_B$ which is aligned with the nominal band. The bands for slices C and D are offset below the nominal band, as indicated by bandwidths $BW_C$ and $BW_D$. The four frequency bands are seen to occupy a total band extending from $f_L$ to $f_H$, instead of the single, narrower $BW_{REF}$ band of the prior apparatus. In apparatus constructed in accordance with the present invention, the bandwidth from $f_L$ to $f_H$ is determined by the relative strengths (slopes) of the $G_x$ and the $G_z$ gradient fields for a given spacing of slices.

To sample signals in the broader $f_L$ to $f_H$ band, a higher sampling frequency is needed than that used for the narrow $BW_{REF}$ band. The higher sampling frequency must satisfy the Nyquist criteria for sampling the broader band without creating aliasing artifacts in the band. The sampling frequency thus determined is the frequency of the $f_{sample}$ signal used for the analog to digital converters in FIG. 3.

As discussed above, there remains the problem of the apparent offset of the respective slice images in the frequency-encoded direction. This problem arises during image reconstruction processing of the acquired NMR signal information. In essence, the mathematical reconstruction algorithms are designed to anticipate that the image data will be confined to a single, predetermined frequency band with a known center frequency corresponding to the center of the image in the frequency-encoded direction. Offsets from the predetermined band and center frequency result in misregistration of the reconstructed image in this direction.

In accordance with the principles of a further aspect of the present invention, this problem is overcome by filtering the NMR signal information prior to reconstruction. The filter function used is a function of the frequency offset used to establish the reference frequency for each slice.

In a preferred embodiment of the present invention, the filter function is embodied in software used to process the NMR signal information. A measure of the frequency offset is retained in the computer and memory 60 of FIG. 3. The offset representative information is of the form ($V_{REF} - V_c$), where $V_{REF}$ represents the control signal for the center frequency of the nominal frequency band $BW_{REF}$, and $V_c$ is the control signal used for acquisition of information from a particular slice.

Figure 7:
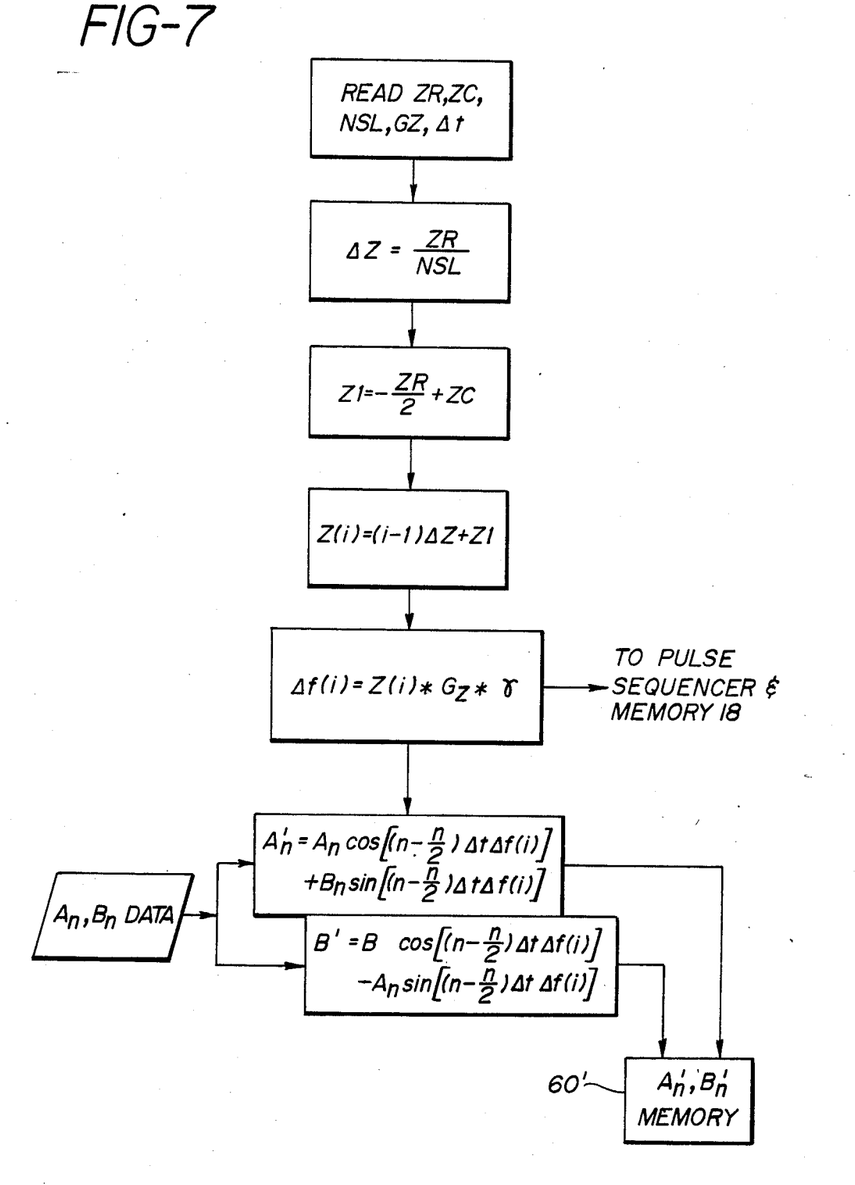
FIG. 7 is a flowchart of a software sequence for performing digital filtering in accordance with the principles of the present invention.

The offset representative signal information is used to digitally filter the NMR signal information as illustrated by the flowchart of FIG. 7. The flowcharted routine is executed by the computer and memory 60 in processing the channel A and channel B NMR signal information. Retained in memory are parameters ZR, AC, NSL, GZ and $\Delta t$, where ZR is the separation range between the two end slices of the slices which are to be imaged; ZC is the location of the center slice along the slice separation direction with respect to the gradient null; NSL is the number of slices; GZ represents the strength of the slice selection gradient, int his example, $G_z$; and $\Delta t$ is the time interval between sampling points of the analog to digital converters. Some of these parameter values are transferred between the computer and memory 60 and the pulse sequencer and memory 18 over the data link 68, as are other values as discussed below.

Using the stored parameter values for a given NMR experiment, the computer calculates a value $\Delta Z = ZR/NSL$, which determines the spacings between the slices. The center of the group of slices with respect to center of the z-gradient field is then used to determine the offset of the initial slice in the z-direction, $Z1 = -ZR/2 + ZC$. From these two calculations, the location of a given slice n is determined by $Z(i) = (i-1)\Delta Z + Z1$.

The results of the two previous calculations are used to determine the frequency offset for a given slice i, which is the difference between the $f_R$ reference frequency for slice i and $f_{REF}$. This calculation multiplies the z spatial location of a slice i by the $G_z$ gradient strength and by the gyromagnetic ratio for a given nuclear element in the NMR system, or $\Delta f(i) = -Z(i)*G_z*Y$. This frequency offset calculation is communicated to the pulse sequencer and memory 18 over data link 68 where it translates directly into a valve for $V_c$. The frequency offset is also used to correct the apparent left/right shift of the NMR signal information by digitally filtering the acquired data by sine and cosine terms of the frequency offset.

The NMR signal information in the form of the digitally detected A and B data values of the channel A and B lines is modified by calculating $$A'_n = A_n \cos[(n-n/2)\Delta t \Delta f(i)] + B_n \sin[(n-n/2)\Delta t \Delta f(i)]$$

and $$B'_n = B_n \cos[(n-n/2)\Delta t \Delta f(i)] - A_n \sin[(n-n/2)\Delta t \Delta f(i)],$$

where n/2 is equal to half the maximum value attained by n (i.e., is a constant). The $A'_n$ and $B'_n$ signal information is then stored in memory for subsequent combination, Fourier transform processing and image reconstruction. In the form of $A'_n$ and $B'_n$ values, the acquired signal information is effectively frequency shifted as if it had been demodulated by an $f_{REF}$ reference signal. In a simplified form, if the frequency offset is expressed in radians as $\Delta \omega$, the A and B data values are modified by trigonometric function of the frequency offset $\cos\Delta\omega t$ and $\sin(-\Delta\omega)t$. The reconstructed slice images will now be identically oriented on the display 66.

What is claimed is:

1. A magnetic resonance imaging system, including a static magnetic field; a plurality of field gradients which have a common spatially located field null point, and in which an imaging area which does not include said field null point is excited by a radio frequency transmitter utilizing a given reference signal and NMR signals from said area are received by a receiver utilizing said given reference signal, said receiver further including means for shifting the frequencies of received NMR signals as a function of the frequency of said given reference signal.

2. A magnetic resonance imaging system comprising:
means for developing a static magnetic field;
means for selecting a region which is to be imaged by applying a radio frequency signal having a given reference frequency;
means for receiving NMR signals from said region;
means for demodulating said NMR signals, said means for demodulating utilizing said given reference frequency; and
means for filtering the demodulated NMR signal information as a function of the difference frequency between said given reference frequency and a system reference frequency.

3. The apparatus of claim 2, further comprising:
means for generating magnetic field gradients within said static magnetic field;
wherein said system reference frequency is equal to the Larmor frequency at a predetermined reference point of the gradient magnetic field.

4. The apparatus of claim 3, wherein said predetermined reference point is a point at which one of said magnetic field gradients makes substantially no contribution to said static magnetic field.

5. The apparatus of claim 3, wherein said demodulating means includes phase detectors utilizing said given reference frequency for phase-sensitive demodulation.

6. The apparatus of claim 5, wherein said filtering means comprises a digital filter for filtering said demodulated NMR signal information as a function of the trigonometric function of the difference frequency between said given reference frequency and a system reference frequency.

7. The apparatus of claim 6, wherein said system reference frequency is equal to the Larmor frequency characteristic of said static magnetic field.

8. The apparatus of claim 7, further comprising:
means for utilizing said filtered NMR signal information to create an image having a frequency-encoded coordinate;
wherein said filtering means shifts lines of said image in the frequency-encoded coordinate direction.

9. A magnetic resonance imaging system, comprising:
means for producing a static magnetic field;
means for producing a magnetic field gradient to said static field which exhibits on a plane a point at which said gradient field makes substantially no contribution to said static field;
means for exciting nuclei located within said static field and occupying a volume which excludes said point, said exciting means utilizing a reference signal of a frequency chosen in accordance with the location of said nuclei with respect to said gradient field;
means for detecting NMR signals utilizing said reference signal; and
means for modifying detected NMR signal information as a function of the difference between said reference signal frequency and a given frequency standard.

10. The magnetic resonance imaging system of claim 9, wherein said given frequency standard is equal to the Larmore frequency at said point.

* * * * *